US009570493B2

(12) United States Patent
Cheng et al.

(10) Patent No.: US 9,570,493 B2
(45) Date of Patent: Feb. 14, 2017

(54) DIELECTRIC GRID BOTTOM PROFILE FOR LIGHT FOCUSING

(71) Applicant: Taiwan Semiconductor Manufacturing Co., Ltd., Hsin-Chu (TW)

(72) Inventors: Yun-Wei Cheng, Taipei (TW);
Horng-Huei Tseng, Hsin-Chu (TW);
Chao-Hsiung Wang, Hsin-Chu (TW);
Chun-Hao Chou, Tainan (TW);
Tsung-Han Tsai, Zhunan Township (TW); Kuo-Cheng Lee, Tainan (TW);
Yung-Lung Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/688,084

(22) Filed: Apr. 16, 2015

(65) Prior Publication Data

US 2016/0307940 A1    Oct. 20, 2016

(51) Int. Cl.
| | | |
|---|---|---|
| *H01L 27/146* | (2006.01) | |
| *H04N 9/04* | (2006.01) | |
| *H01L 31/18* | (2006.01) | |
| *H01L 31/0232* | (2014.01) | |

(52) U.S. Cl.
CPC ....... *H01L 27/1463* (2013.01); *H01L 27/1464* (2013.01); *H01L 27/14621* (2013.01); *H01L 27/14627* (2013.01); *H01L 27/14685* (2013.01)

(58) Field of Classification Search
CPC ........... H01L 27/1463; H01L 27/14621; H01L 27/14627; H01L 27/1464; H01L 27/14685

USPC .................................................. 257/427–437
See application file for complete search history.

(56) References Cited

U.S. PATENT DOCUMENTS

| | | |
|---|---|---|
| 7,138,618 B2 | 11/2006 | Mishina et al. |
| 8,530,266 B1 | 9/2013 | Chen et al. |
| 8,766,386 B2 | 7/2014 | Tsuji |
| 8,803,067 B2 | 8/2014 | Mizuta et al. |
| 2001/0026322 A1 | 10/2001 | Takahashi et al. |
| 2008/0116537 A1 | 5/2008 | Adkisson et al. |
| 2010/0181634 A1 | 7/2010 | Wang et al. |

(Continued)

FOREIGN PATENT DOCUMENTS

WO        2012128076 A1    9/2012

OTHER PUBLICATIONS

U.S. Appl. No. 14/713,172, filed May 15, 2015.

(Continued)

*Primary Examiner* — Marcos D Pizarro
*Assistant Examiner* — Nelson Garces
(74) *Attorney, Agent, or Firm* — Eschweiler & Associates, LLC

(57) ABSTRACT

A back side illumination (BSI) image sensor with a dielectric grid opening having a curved lower surface is provided. A pixel sensor is arranged within a semiconductor substrate. A metallic grid is arranged over the pixel sensor and defines a sidewall of a metallic grid opening. A dielectric grid is arranged over the metallic grid and defines a sidewall of the dielectric grid opening. A capping layer is arranged over the metallic grid, and defines the curved lower surface of the dielectric grid opening. A method for manufacturing the BSI image sensor is also provided.

17 Claims, 10 Drawing Sheets

(56) References Cited

U.S. PATENT DOCUMENTS

| | | | | |
|---|---|---|---|---|
| 2012/0267743 | A1* | 10/2012 | Nakamura | H01L 27/14621 257/432 |
| 2012/0268631 | A1* | 10/2012 | Takase | G02B 3/0068 348/273 |
| 2013/0134536 | A1 | 5/2013 | Mori et al. | |
| 2014/0061842 | A1 | 3/2014 | Ting et al. | |
| 2014/0339606 | A1* | 11/2014 | Lin | H01L 27/14685 257/228 |
| 2014/0339615 | A1* | 11/2014 | Wang | H01L 27/14621 257/294 |
| 2015/0048467 | A1 | 2/2015 | Weng et al. | |
| 2015/0087104 | A1 | 3/2015 | Tseng et al. | |
| 2015/0171125 | A1* | 6/2015 | Jangjian | H01L 27/14627 257/432 |
| 2015/0270298 | A1 | 9/2015 | Lin et al. | |
| 2016/0033688 | A1* | 2/2016 | Wu | G02B 3/0068 359/622 |

OTHER PUBLICATIONS

U.S. Appl. No. 14/688,094, filed Apr. 16, 2015.
U.S. Appl. No. 14/688,106, filed Apr. 16, 2015.
EMD Performance Materials. Anti Reflective Coatings. Feb. 5, 2015. Retrieved from http://www.emd-performance-materials.com/en/electronic_materials/glossary/anti_reflective_coatings_glossary/anti_reflective_coatings_glossary.html.
Non Final Office Action Dated Apr. 12, 2016 U.S. Appl. No. 14/713,172.
Non Final Office Action Dated Mar. 15, 2016 U.S. Appl. No. 14/688,106.
Final Office Action Dated Aug. 10, 2016 U.S. Appl. No. 14/688,106.
Non Final Office Action Dated Aug. 18, 2016 U.S. Appl. No. 14/688,094.
Final Office Action Dated Oct. 28, 2016 U.S. Appl. No. 14/713,172.

* cited by examiner

DIELECTRIC GRID BOTTOM PROFILE FOR LIGHT FOCUSING

BACKGROUND

Many modern day electronic devices comprise optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) image sensor. BSI image sensor fabrication can be integrated into conventional semiconductor processes for low cost, small size, and high through-put. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
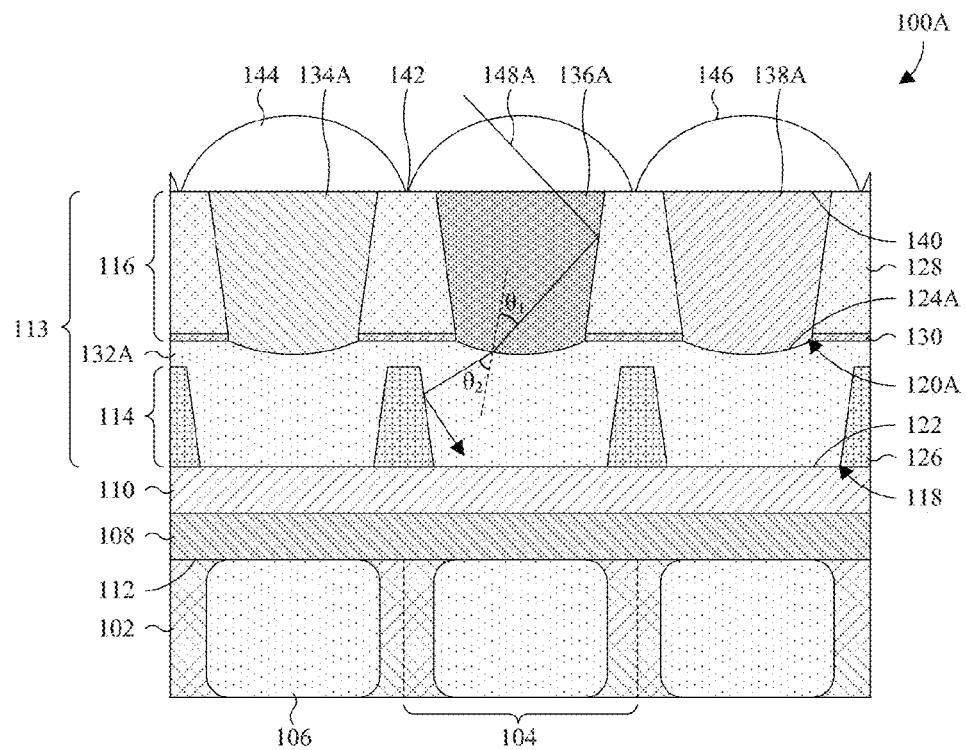
FIG. 1A illustrates a cross-sectional view of some embodiments of a back-side illuminated (BSI) image sensor having color filters with concave lower surfaces.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Back side illumination (BSI) image sensors typically include pixels sensors arranged within a semiconductor substrate of an integrated circuit. The pixel sensors are arranged between a back side of the integrated circuit and a back-end-of-line (BEOL) metallization stack of the integrated circuit. Micro-lenses and color filters corresponding to the pixel sensors are stacked on the back side of the integrated circuit over the corresponding pixel sensors. The color filters are configured to selectively transmit assigned wavelengths of radiation to the corresponding pixel sensors, and the micro-lenses are configured to focus incident radiation (e.g., photons) onto the color filters.

A stacked grid is typically arranged on the back side of the integrated circuit. The stacked grid includes a metallic grid and a dielectric grid overlying the metallic grid. The metallic grid is laterally arranged around metallic grid openings corresponding to the pixel sensors. The metallic grid openings are filled by a capping layer that vertically spaces the dielectric grid from the metallic grid. The dielectric grid is laterally arranged around dielectric grid openings corresponding to the pixel sensors and having planar lower surfaces. The dielectric grid openings are filled with the color filters. The dielectric grid is configured to guide or otherwise focus radiation entering the color filters towards the pixel sensors by total internal reflection. However, after reaching the planar lower surfaces of the dielectric grid openings, the radiation may diverge (e.g., by refraction). Such divergence may increase cross talk between neighboring pixel sensors and reduce optical performance.

In view of the foregoing, the present disclosure is directed to a BSI image sensor that has a dielectric grid opening with a curved lower surface for focusing radiation, as well as a method for manufacturing the BSI image sensor. In some embodiments, the BSI image sensor includes a pixel sensor arranged within a semiconductor substrate. A metallic grid is arranged over the semiconductor substrate, and a dielectric grid is arranged over the metallic grid. The metallic grid and the dielectric grid respectively define sidewalls for a metallic grid opening and a dielectric grid opening overlying the pixel sensor. A capping layer is arranged between the metallic and the dielectric grids, and fills the metallic grid opening. Further, the capping layer defines a curved lower surface of the dielectric grid opening. A color filter is arranged in the dielectric grid opening, and a micro lens is arranged over the color filter. The color filter has a refractive index differing from that of the capping layer.

The different refractive indexes of the color filter and the capping layer, and the curved lower surface of the dielectric grid opening, focus radiation entering the color filter and impinging on the curved lower surface towards the pixel sensor. In a sense, the curved lower surface acts as a lens. By focusing radiation towards the pixel sensor, cross talk between neighboring pixel sensors is reduced and optical performance is improved. Further, the curved lower surface can advantageously be achieved without additional processing steps through etching process tuning.

With reference to FIG. 1A, a cross-sectional view 100A of some embodiments of a BSI image sensor is provided. The BSI image sensor includes a semiconductor substrate 102 and pixel sensors 104 arranged within the substrate 102, typically in rows and/or columns. The pixels sensors 104 are configured to convert incident radiation (e.g., photons) into electrical signals. The pixel sensors 104 include corresponding photodetectors 106 and, in some embodiments, corresponding amplifiers (not shown). The photodetectors 106 may be, for example, photodiodes, and the amplifiers may be, for example, transistors. The photodiodes may include, for example, corresponding first regions (not shown) within the semiconductor substrate 102 having a first doping type (e.g., n-type doping), and corresponding second regions (not shown) overlying the first regions within the substrate 102 having a second doping type (e.g., p-type doping) that is different than the first doping type.

An antireflective coating (ARC) 108 and/or a buffer layer 110 are arranged over the semiconductor substrate 102 along an upper surface 112 of the substrate 102. In embodiments where both the ARC 108 and the buffer layer 110 are present, the buffer layer 110 is typically arranged over the ARC 108. The ARC 108 may be, for example, an organic polymer or a metallic oxide. The buffer layer 110 may be, for example, an oxide, such as silicon dioxide. The ARC 108 and/or the buffer layer 110 vertically space the semiconductor substrate 102 from a stacked grid 113 that overlies the substrate 102.

The stacked grid 113 includes a metallic grid 114 and a dielectric grid 116 overlying the metallic grid 114. The metallic grid 114 and the dielectric grid 116 respectively define sidewalls for metallic grid openings 118 and dielectric grid openings 120A corresponding to the pixel sensors 104, and are configured to confine and guide radiation entering the openings 118, 120A towards the pixel sensors 104. Typically, the metallic and/or dielectric grid openings 118, 120A at least partially overly the corresponding pixel sensors 104. In some embodiments, as illustrated, centers of the metallic grid openings 118 and/or the dielectric grid openings 120A are aligned over centers of the corresponding pixel sensors 104. In alternative embodiments, centers of the metallic grid openings 118 and/or the dielectric grid openings 120A are laterally shifted or offset from centers of the corresponding pixel sensors 104. The metallic grid openings 118 have substantially planar lower surfaces 122, which may be defined by the ARC 108 and/or the buffer layer 110. The dielectric grid openings 120A have curved lower surfaces. The curved lower surfaces are configured with a curvature that is dependent upon refractive indices of color filters (described hereafter) and an underlying capping layer (described hereafter). For example, as shown in FIG. 1A, if the color filter has a greater refractive index than the capping layer, the dielectric grid openings 120A will have concave lower surfaces 124A.

The metallic grid 114 and the dielectric grid 116 are respectively arranged within metallic and dielectric grid layers 126, 128 stacked over the ARC 108 and/or the buffer layer 110. The metallic grid 114 is arranged within a metallic grid layer 126 overlying the ARC 108 and/or the buffer layer 110. The metallic grid layer 126 may be, for example, tungsten, copper, or aluminum copper. The dielectric grid 116 is arranged within a dielectric grid layer 128 stacked over the metallic grid layer 126. In some embodiments, the dielectric grid 116 is further arranged within an etch stop layer 130 and/or some other layer (e.g., one or more additional dielectric grid layers) underlying the dielectric grid layer 128. The dielectric grid layer 128 may be, for example, an oxide, such as silicon oxide. The etch stop layer 130 may be, for example, a nitride, such as silicon nitride.

A capping layer 132A is arranged over the metallic grid layer 126 between the metallic grid layer 126 and the dielectric grid layer 128. The capping layer 132A spaces the dielectric grid 116 from the metallic grid 114 and fills the metallic grid openings 118. Further, the capping layer 132A defines the concave lower surfaces 124A of the dielectric grid openings 120A and, in some embodiments, partially defines sidewalls of the dielectric grid openings 120A. The capping layer 132A is a dielectric, such as silicon dioxide. In some embodiments, the capping layer 132A is or otherwise includes the same material as the buffer layer 110 and/or the dielectric grid layer 128. For example, in some embodiments without the etch stop layer 130, the capping layer 132A and the dielectric grid layer 128 may share a molecular structure and/or correspond to different regions of the same layer (e.g., a layer formed by a single deposition).

Color filters 134A, 136A, 138A corresponding to the pixel sensors 104 are arranged in the dielectric grid openings 120A to fill the dielectric grid openings 120A. The color filters 134A, 136A, 138A typically have planar upper surfaces 140 that are approximately coplanar with an upper surface 142 of the dielectric grid layer 128. The color filters 134A, 136A, 138A are assigned corresponding colors or wavelengths of radiation, and are configured to transmit radiation corresponding to the assigned colors or wavelengths to the corresponding pixel sensors 104. Typically, the color filter 134A, 136A, 138A assignments alternate between red, green, and blue, such that the color filters 134A, 136A, 138A include red color filters 134A, green color filters 136A, and blue color filters 138A. In some embodiments, the color filter assignments alternative between red, green, and blue light according to a Bayer mosaic. The color filters 134A, 136A, 138A are of a first material with a refractive index greater than that of a second material abutting the first material at the concave lower surfaces 124A of the dielectric grid openings 120A. Typically, the second material is that of the capping layer 132A and/or the dielectric grid layer 128.

Micro-lenses 144 corresponding to the pixel sensors 104 are arranged over the color filters 134A, 136A, 138A and the pixel sensors 104. Centers of the micro-lenses 144 are typically aligned with centers of the pixel sensors 104, but centers of the micro-lenses 144 may be laterally shifted or offset from centers of the pixel sensors 104. The micro-lenses 144 are configured to focus incident radiation (e.g., light) towards the pixel sensors 104. In some embodiments, the micro-lenses 144 have convex upper surfaces 146 configured to focus radiation towards the color filters 134A, 136A, 138A and/or the pixel sensors 104.

In operation, the concave lower surfaces 124A of the dielectric grid openings 120A serve as lenses to focus or concentrate radiation on the corresponding pixel sensors 104. Radiation entering the color filters 134A, 136A, 138A, and impinging on the concave lower surfaces 124A of the dielectric grid openings 120A, may refract towards the metallic grid 114 with an angle of refraction greater than an angle of incidence. Upon impinging on the metallic grid 114, the radiation may reflect towards the pixel sensors 104. For example, suppose a light ray 148A enters a color filter 136A, reflects off a sidewall of the color filter 136A towards a concave lower surface of the corresponding dielectric grid opening, and impinges on the concave lower surface with an angle of incidence $\theta_1$. Further, suppose the color filter 136A has a refractive index $n_1$, and the capping layer 132A has a refractive index $n_2$. In such instances, since $n_1$ is greater than $n_2$, $\theta_2$ is greater than $\theta_1$ and can be computed according to Snell's law as follows.

$$\theta_2 = \sin^{-1}\left(\frac{n_1 \sin(\theta_1)}{n_2}\right)$$

Advantageously, focusing or concentrating radiation on the pixel sensors 104 reduces cross talk between neighboring pixel sensors and improves optical performance.

Figure 1B:
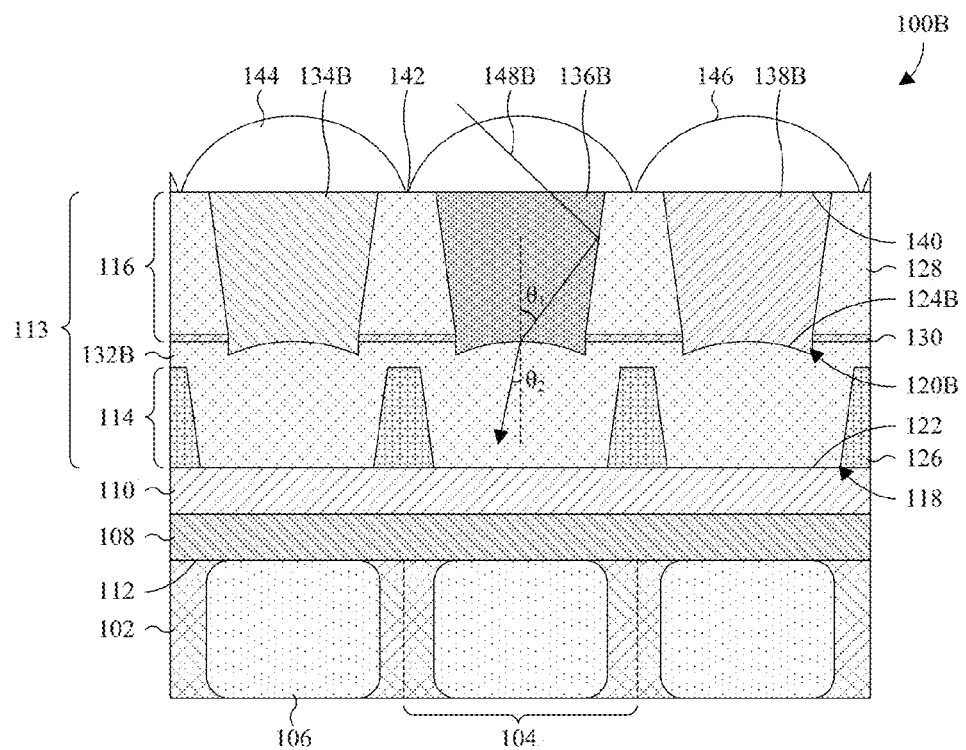
FIG. 1B illustrates a cross-sectional view of some embodiments of a BSI image sensor having color filters with convex lower surfaces.

With reference to FIG. 1B, a cross-sectional view 100B of other embodiments of a BSI image sensor is provided. The BSI image sensor includes a dielectric grid 116 arranged over a capping layer 132B. The dielectric grid 116 defines sidewalls for dielectric grid openings 120B overlying corresponding pixel sensors 104, and the capping layer 132B defines a convex lower surface 124B of the dielectric grid openings 120B.

In some embodiments, the convex lower surface 124B is arranged below a bottom surface of the dielectric grid layer 128 and a bottom surface of the etch stop layer 130. Color filters 134B, 136B, 138B corresponding to the pixel sensors 104 are arranged in the dielectric grid openings 120B to fill the dielectric grid openings 120B. The color filters 134B, 136B, 138B are of a first material with a refractive index less than that of a second material abutting the first material at the convex lower surfaces 1248 of the dielectric grid openings 120B. Typically, the second material is that of the capping layer 132B and/or the dielectric grid layer 128.

In operation, the convex lower surfaces 124B of the dielectric grid openings 120B serve as lenses to focus or concentrate radiation on the corresponding pixel sensors 104. Radiation entering the color filters 134B, 136B, 138B, and impinging on the convex lower surfaces 124B of the dielectric grid openings 120B, may refract towards the pixel sensors 104 with an angle of refraction $\theta_2$ less than an angle of incidence $\theta_1$. For example, suppose a light ray 148B enters a color filter 136B, reflects off a sidewall of the color filter 136B towards a convex lower surface of the corresponding dielectric grid opening, and impinges on the convex lower surface with an angle of incidence $\theta_1$. Further, suppose the color filter 136B has a refractive index $n_1$, and the capping layer 132B has a refractive index $n_2$. In such instances, since $n_1$ is less than $n_2$, $\theta_2$ is less than $\theta_1$ and can be computed according to Snell's Law. Advantageously, focusing or concentrating radiation on the pixel sensors 104 reduces cross talk between neighboring pixel sensors and improves optical performance.

Figure 2A:
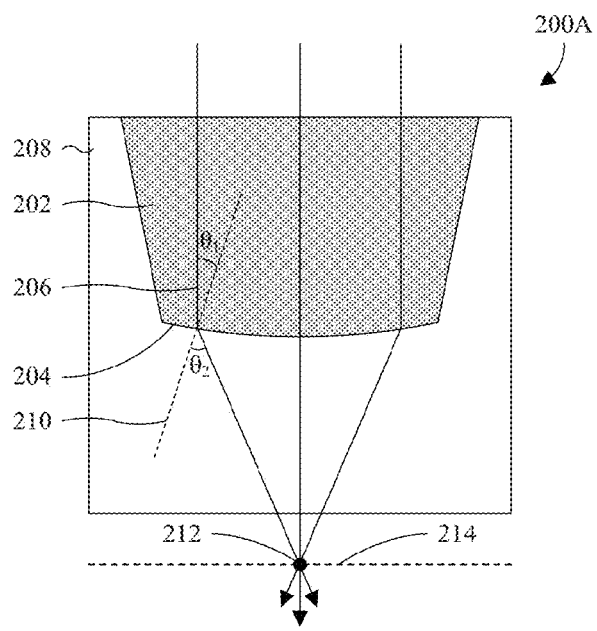
FIG. 2A illustrates a ray diagram of some embodiments of a BSI image sensor having a color filter with a concave lower surface.

With reference to FIG. 2A, a ray diagram 200A of some embodiments of a BSI image sensor having a color filter 202 with a concave lower surface 204 is provided. As illustrated, light rays 206 enter the color filter 202 and impinge on the concave lower surface 204 in parallel. Since the color filter 202 has a first index of refraction that is greater than a second index of refraction of an underlying, abutting layer 208, the light rays 206 will refract away from corresponding normal axes 210 to an underlying focal point 212 (similar to a convex lens) proximate to an underlying pixel sensor. In other words, the higher refractive index of the color filter 202 relative to the underlying layer 208 causes the light rays 206 to have angles of refraction $\theta_2$ that are greater than corresponding angles of incidence $\theta_1$, thereby focusing the light rays 206 towards the underlying pixel sensor. Other light rays (not shown) that are not parallel to the light rays 206 and that enter the color filter 202 refract as described above and intersect other focal points along a focal plane 214, which includes the focal point 212.

Figure 2B:
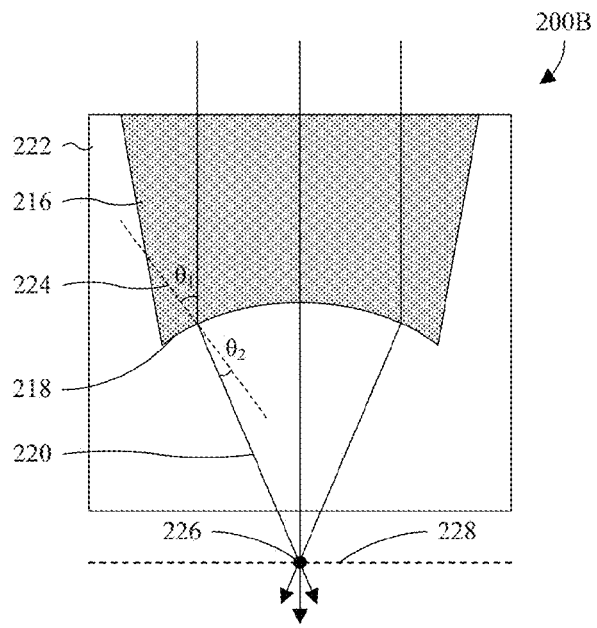
FIG. 2B illustrates a ray diagram of some embodiments of a BSI image sensor having a color filter with a convex lower surface.

With reference to FIG. 2B, a ray diagram 200B of some embodiments of a BSI image sensor having a color filter 216 with a convex lower surface 218 is provided. As illustrated, light rays 220 enter the color filter 216 and impinge on the convex lower surface 218 in parallel. Since the color filter 216 has a first index of refraction that is less than a second index of refraction of an underlying, abutting layer 222, the light rays 220 will refract towards corresponding normal axes 224 to an underlying focal point 226 (similar to a convex lens) proximate to an underlying pixel sensor. In other words, the low refractive index of the color filter 216 relative to the underlying layer 222 causes the light rays 220 to have angles of refraction $\theta_2$ that are less than corresponding angles of incidence $\theta_1$, thereby focusing the light rays 220 towards the underlying pixel sensor. Other light rays (not shown) that are not parallel to the light rays 220 and that enter the color filter 216 refract as described above and intersect other focal points along a focal plane 228, which includes the focal point 226.

Figure 3:
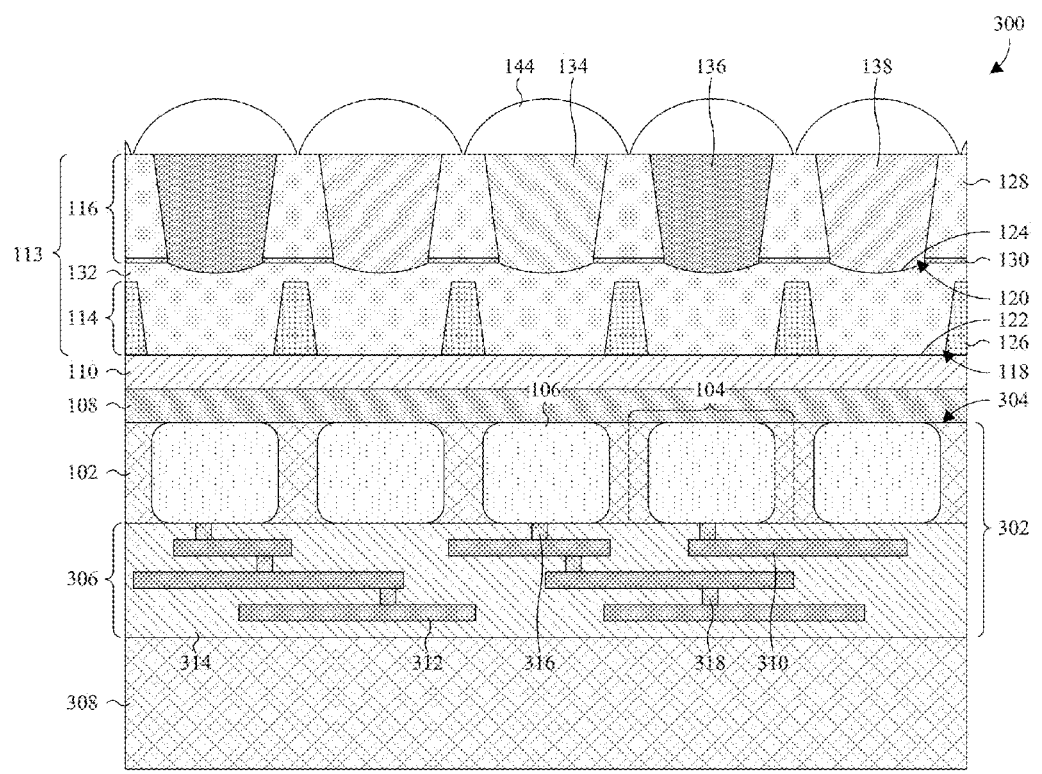
FIG. 3 illustrates a cross-sectional view of some embodiments of a BSI image sensor having color filters with curved lower surfaces.

With reference to FIG. 3, a cross-sectional view 300 of yet other embodiments of a BSI image sensor is provided. The BSI image sensor includes an array of pixel sensors 104 arranged in rows and columns in a semiconductor substrate 102 of an integrated circuit 302 between a back side 304 of the integrated circuit 302 and a BEOL metallization stack 306 of the integrated circuit 302. The pixel sensors 104 include corresponding photodetectors 106 and, in some embodiments, amplifiers (not shown). The photodetectors 106 are configured to convert incident radiation (e.g., photons) into electrical signals, and may be, for example, photodiodes.

The BEOL metallization stack 306 underlies the semiconductor substrate 102 between the semiconductor substrate 102 and a carrier substrate 308. The BEOL metallization stack 306 includes a plurality of metallization layers 310, 312 stacked within an interlayer dielectric (ILD) layer 314. One or more contacts 316 of the BEOL metallization stack 306 extend from a metallization layer 310 to the pixel sensors 104. Further, one or more vias 318 of the BEOL metallization stack 306 extend between the metallization layers 310, 312 to interconnect the metallization layers 310, 312. The ILD layer 314 may be, for example, a low κ dielectric (i.e., a dielectric with a dielectric constant less than about 3.9) or an oxide. The metallization layers 310, 312, the contacts 316, and the vias 318 may be, for example, a metal, such as copper or aluminum.

An ARC 108 and/or a buffer layer 110 are arranged along the back side 304 of the integrated circuit 302, and a stacked grid 113 is arranged over the ARC 108 and/or the buffer layer 110. The stacked grid 113 includes a metallic grid 114 and a dielectric grid 116 overlying the metallic grid 114. The metallic grid 114 and the dielectric grid 116 are respectively arranged within metallic and dielectric grid layers 126, 128 stacked over the ARC 108 and/or the buffer layer 110. In some embodiments, the dielectric grid 116 is further arranged within an etch stop layer 130 underlying a dielectric grid layer 128 of the dielectric grid 116. Further, the metallic grid 114 and the dielectric grid 116 respectively define sidewalls for metallic grid openings 118 and dielectric grid openings 120 corresponding to the pixel sensors 104. The metallic grid openings 118 have substantially planar lower surfaces 122, which may be defined by the ARC 108 and/or the buffer layer 110, whereas the dielectric grid openings 120 have curved lower surfaces 124. The curved lower surfaces 124 may be concave (e.g., as illustrated, and described in FIG. 1A) or convex (e.g., as described in FIG. 1B).

A capping layer 132 is arranged over the metallic grid 114 between the metallic grid layer 126 and the dielectric grid layer 128. Further, color filters 134, 136, 138 and micro lenses 144 corresponding to the pixel sensors 104 are over the corresponding pixel sensors 104. The color filters 134, 136, 138 fill the dielectric grid openings 120, and the micro lenses 144 mask the color filters 134, 136, 138 to focus light into the color filters 134, 136, 138.

Figure 4:
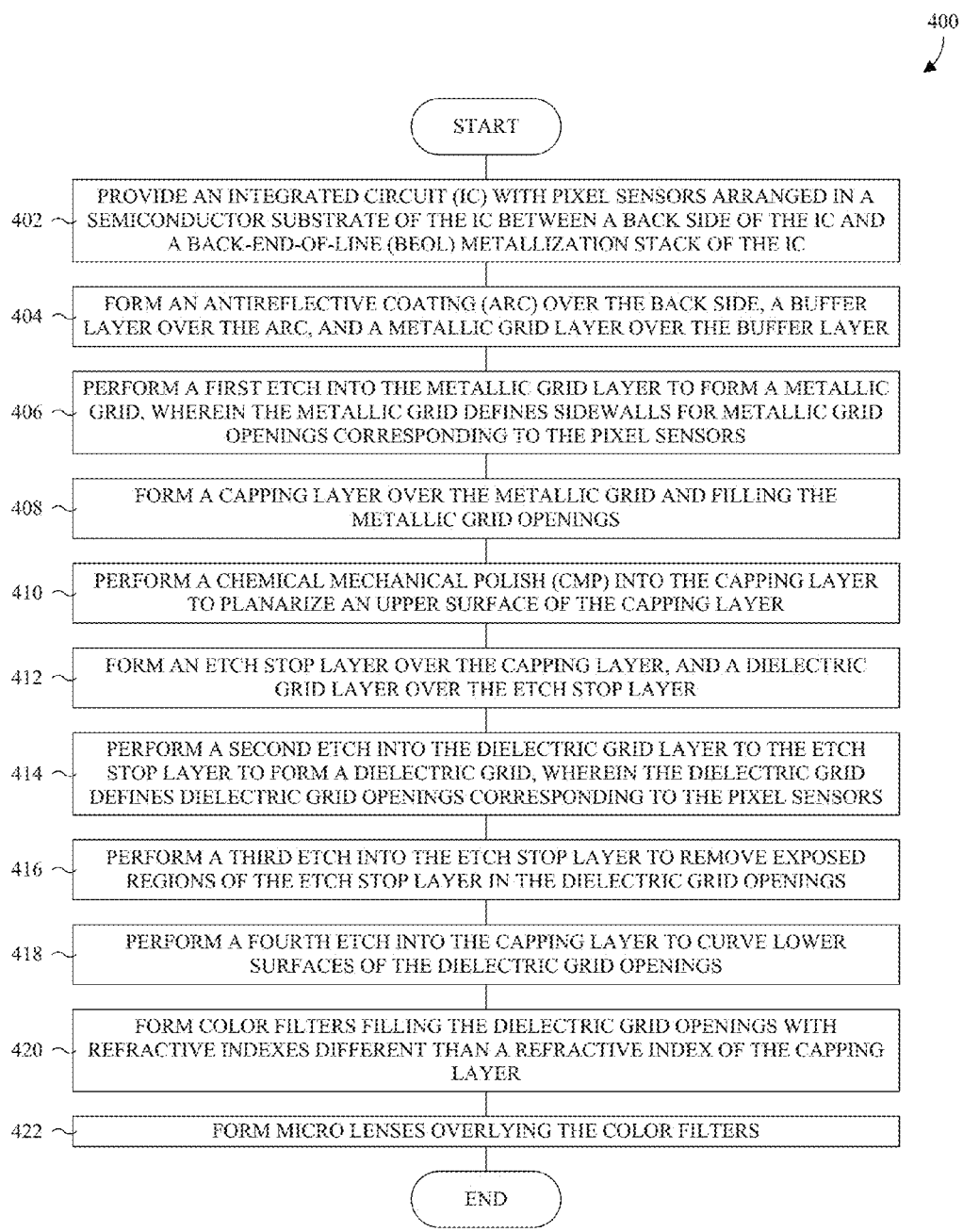
FIG. 4 illustrates a flowchart of some embodiments of a method for manufacturing a BSI image sensor having color filters with curved lower surfaces.

With reference to FIG. 4, a flowchart 400 of some embodiments of a method for manufacturing a BSI image sensor having color filters with curved lower surfaces.

At 402, an integrated circuit is provided with pixel sensors arranged in a semiconductor substrate of the integrated circuit between a back side of the integrated circuit and a BEOL metallization stack of the integrated circuit.

At 404, an ARC is formed over the back side, a buffer layer is formed over the ARC, and a metallic grid layer is formed over the buffer layer.

At 406, a first etch is performed into the metallic grid layer to form a metallic grid. The metallic grid defines sidewalls for metallic grid openings corresponding to the pixel sensors.

At 408, a capping layer is formed over the metallic grid and filling the metallic grid openings.

At 410, a chemical mechanical polish (CMP) is performed into the capping layer to planarize an upper surface of the capping layer.

At 412, an etch stop layer is formed over the capping layer, and a dielectric grid layer is formed over the etch stop layer.

At 414, a second etch into the dielectric grid layer to the etch stop layer to form a dielectric grid. The dielectric grid defines dielectric grid openings corresponding to the pixel sensors.

At 416, a third etch is performed into the etch stop layer to remove exposed regions of the etch stop layer in the dielectric grid openings.

At 418, a fourth etch is performed into the capping layer to curve lower surfaces of the dielectric grid openings.

At 420, color filters are formed filling the dielectric grid openings with refractive indexes different than a refractive index of the capping layer. Advantageously, the differing refractive indexes, combined with the curved lower surfaces of the dielectric grid openings, focus radiation towards underlying pixel sensors. This advantageously reduces dispersion of radiation proximate the lower surface of the dielectric grid, and reduces cross talk between neighboring pixel sensors. Further, this advantageously improves optical performance.

At 422, micro lenses are formed over the color filters.

While the method described by the flowchart 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some alternative embodiments, the second and third etches, and/or the third and fourth etches, may be performed together (e.g., with a common etchant). Further, in some embodiments, the etch stop layer and Act 416 may be omitted. In such embodiments, the second etch may be time based using known etch rates. Even more, in some alternative embodiments, the capping layer and the dielectric grid layer may correspond to different regions of a common layer. In such embodiments, Acts 408, 410, 412 may be omitted. In place of Acts 408, 410, 412, a common layer may formed (e.g., with a single deposition) over the metallic grid and filling the metallic grid openings. Further, a CMP may performed into the common layer to planarize an upper surface of the common layer, and Acts 414-422 may be performed.

With reference to FIGS. 5-11, 12A & B, and 13A & B, cross-sectional views of some embodiments of a BSI image sensor at various stages of manufacture are provided to illustrate the method of FIG. 4. Although FIGS. 5-11, 12A & B, and 13A & B are described in relation to the methods, it will be appreciated that the structures disclosed in FIGS. 5-11, 12A & B, and 13A & B are not limited to the methods, but instead may stand alone as structures independent of the methods. Similarly, although the methods are described in relation to FIGS. 5-11, 12A & B, and 13A & B, it will be appreciated that the methods are not limited to the structures disclosed in FIGS. 5-11, 12A & B, and 13A & B, but instead may stand alone independent of the structures disclosed in FIGS. 5-11, 12A & B, and 13A & B.

Figure 5:
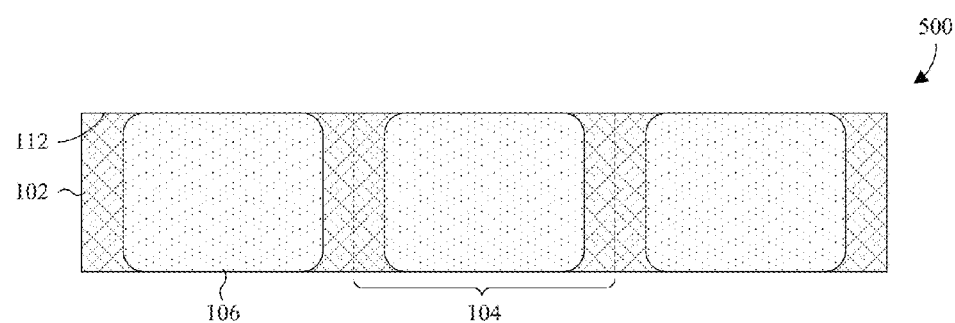
FIGS. 5-11, 12A & B, and 13A & B illustrate a series of cross-sectional views of some embodiments of a BSI image sensor at various stages of manufacture.

FIG. 5 illustrates a cross-sectional view 500 of some embodiments corresponding to Act 402. As illustrated, a semiconductor substrate 102 with pixel sensors 104 arranged within the substrate 102 is provided. In some embodiments, the semiconductor substrate 102 is part of an integrated circuit and the pixel sensors 104 are arranged between a back side of the integrated circuit (e.g., an upper surface 112 of the substrate 102) and a BEOL metallization stack (not shown) of the integrated circuit. The pixel sensors 104 include photodetectors 106, such as photodiodes. The semiconductor substrate 102 may be, for example, a bulk semiconductor substrate or a silicon-on-insulator (SOI) substrate.

Figure 6:
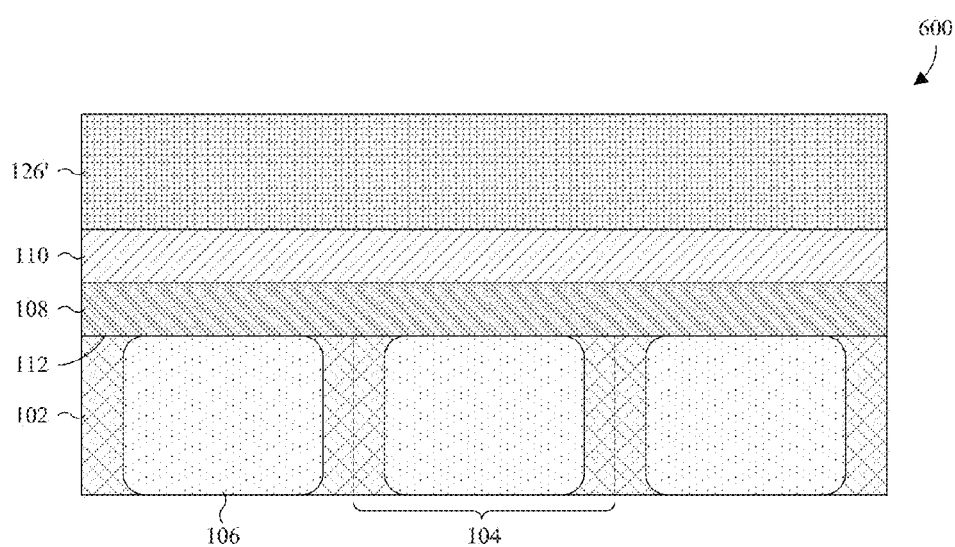

FIG. 6 illustrates a cross-sectional view 600 of some embodiments corresponding to Act 404. As illustrated, an ARC 108 and/or a buffer layer 110 are formed stacked in that order over the semiconductor substrate 102. Further, a metallic grid layer 126' is formed over the ARC 108 and/or the buffer layer 110. The ARC 108, the buffer layer 110, and the metallic grid layer 126' may be sequentially formed by deposition techniques, such as spin coating or vapor deposition. The ARC 108 may be formed of, for example, an organic polymer or a metallic oxide. The buffer layer 110 may be formed of, for example, an oxide, such as silicon dioxide. The metallic grid layer 126' may be formed of, for example, tungsten, copper, aluminum, or aluminum copper.

Figure 7:
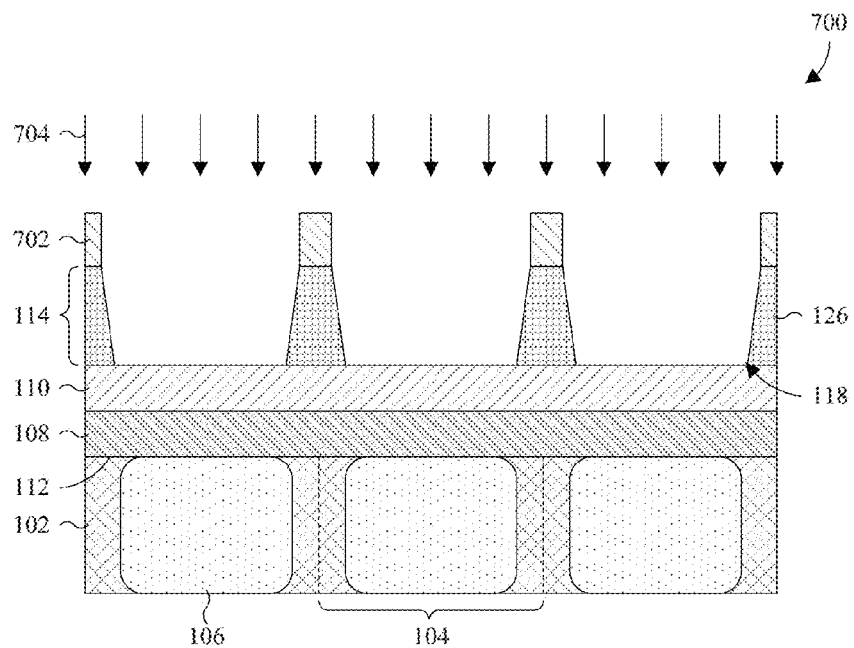

FIG. 7 illustrates a cross-sectional view 700 of some embodiments corresponding to Act 406. As illustrated, a first etch is performed into the metallic grid layer 126', through regions overlying the pixel sensors 104, to the ARC 108 and/or the buffer layer 110. The first etch forms a metallic grid 114 defining sidewalls for metallic grid openings 118 corresponding to the pixel sensors 104. Typically, the metallic grid openings 118 at least partially overly the corresponding pixel sensors 104.

The process for performing the first etch may include forming a first photoresist layer 702 masking regions of the metallic grid layer 126' corresponding to the metallic grid 114. An etchant 704 may then be applied to the metallic grid layer 126' according to a pattern of the first photoresist layer 702, thereby defining the metallic grid 114. The etchant 704 may be selective of the metallic grid layer 126' relative to the ARC 108 and/or the buffer layer 110. Further, the etchant 704 may be, for example, a dry etchant. After applying the etchant 704, the first photoresist layer 702 may be removed or otherwise stripped.

Figure 8:
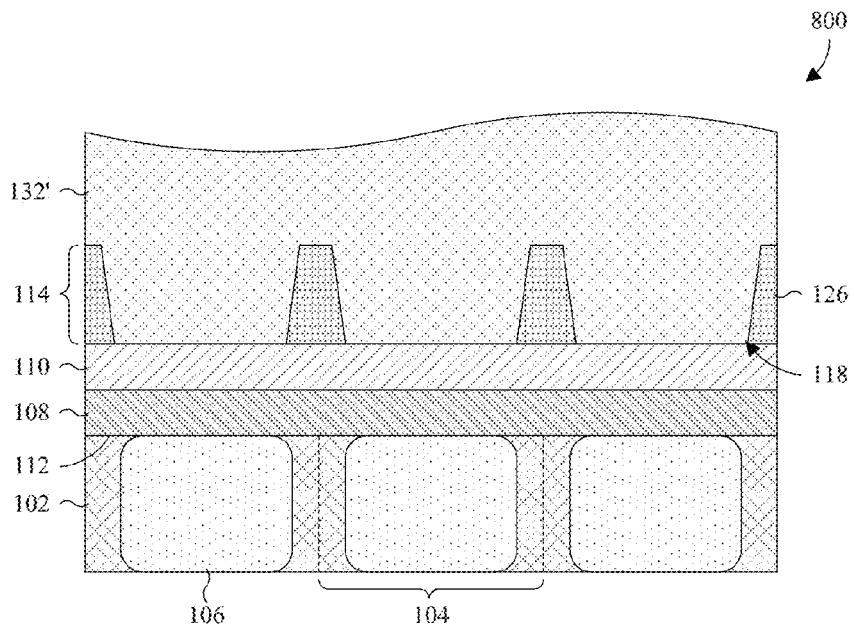

FIG. 8 illustrates a cross-sectional view 800 of some embodiments corresponding to Act 408. As illustrated, a capping layer 132' is formed over the metallic grid 114 and the remaining metallic grid layer 126, and filling the metallic grid openings 118. The capping layer 132' may be formed of, for example, a dielectric, such as an oxide, and/or may be formed of, for example, the same material as the buffer layer 110. Further, the capping layer 132' may be formed using, for example, a deposition technique, such as spin coating or vapor deposition.

Figure 9:
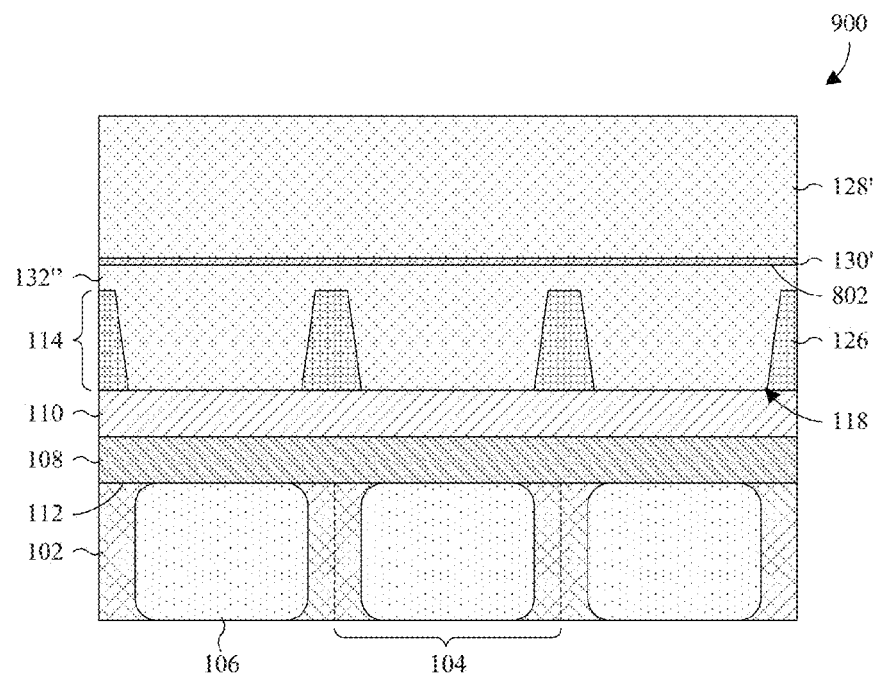

FIG. 9 illustrates a cross-sectional view 900 of some embodiments corresponding to Acts 410 and 412. As illustrated, a CMP is performed into the capping layer 132' to a point over the remaining metallic grid layer 126, thereby resulting in a substantially planar upper surface 902. Also illustrated, an etch stop layer 130' and a dielectric grid layer 128' are formed stacked in that order over the remaining capping layer 132". The etch stop layer 130' and the dielectric grid layer 128' may be formed using, for example, a deposition technique, such as vapor deposition. The etch stop layer 130' may be formed of, for example, a nitride, such as silicon nitride. The dielectric grid layer 128' may be formed of, for example, silicon dioxide, and/or may be formed of, for example, the same material as the remaining capping layer 132". In alternative embodiments, the etch stop layer 130' may be omitted.

Figure 10:
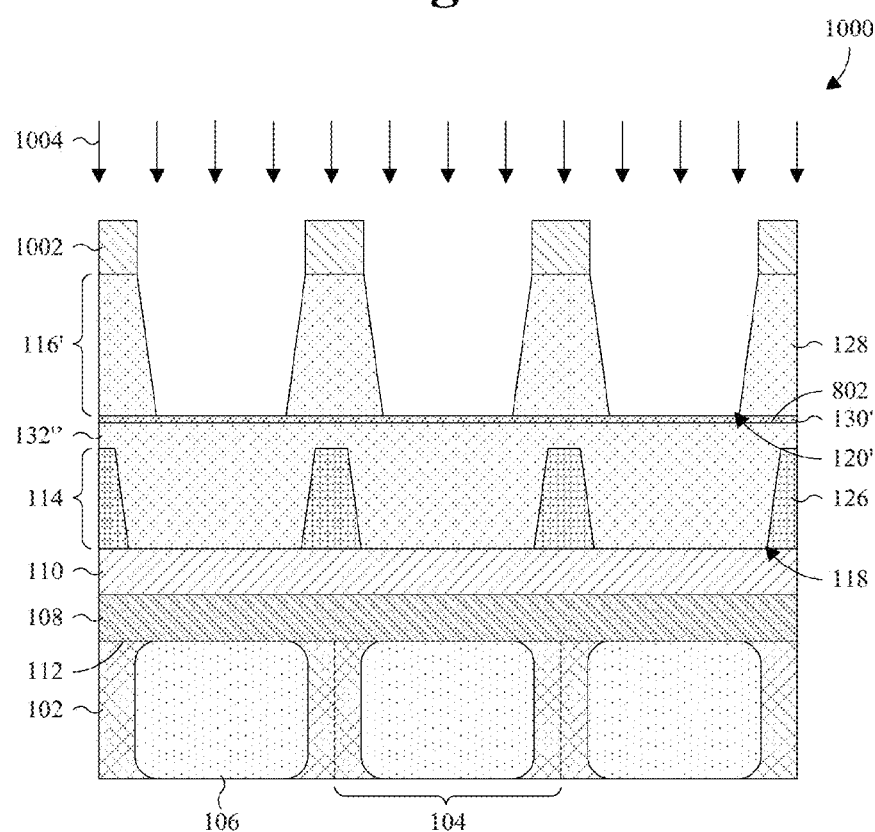

FIG. 10 illustrates a cross-sectional view 1000 of some embodiments corresponding to Act 414. As illustrated, a second etch is performed into the dielectric grid layer 128', through regions overlying the pixel sensors 104, to the etch stop layer 130'. The second etch forms a dielectric grid 116' defining sidewalls for dielectric grid openings 120' corresponding to the pixel sensors 104. Typically, the dielectric grid openings 120' at least partially overly the corresponding pixel sensors 104.

The process for performing the second etch may include forming a second photoresist layer 1002 masking regions of the dielectric grid layer 128' corresponding to the dielectric grid 116'. An etchant 1004 may then be applied to the dielectric grid layer 128' according to a pattern of the second photoresist layer 1002, thereby defining the dielectric grid 116'. The etchant 1004 may be selective of the dielectric grid layer 128' relative to the etch stop layer 130'. Further, the etchant 1004 may be, for example, a dry etchant. After applying the etchant 1004, the second photoresist layer 1002 may be removed or otherwise stripped.

Figure 11:
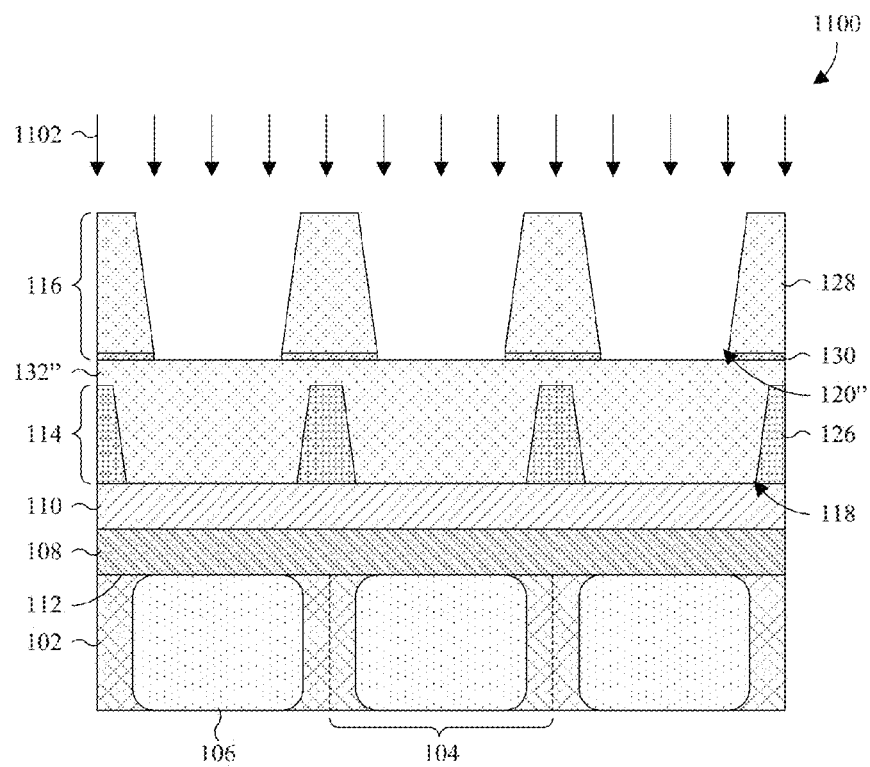

FIG. 11 illustrates a cross-sectional view 1100 of some embodiments corresponding to Act 416. As illustrated, a third etch is performed into the etch stop layer 130', through exposed regions in the dielectric grid openings 120', to the remaining capping layer 132". The third etch removes regions of the etch stop layer 130' in the dielectric grid openings 120'. The process for performing the third etch may include, for example, applying an etchant 1102 to the etch stop layer 130'. The etchant 1102 may be selective of the etch stop layer 130' relative to the dielectric grid layer 128 and/or the remaining capping layer 132". Further, the etchant 1102 may be, for example, a wet etchant.

Figure 12A:
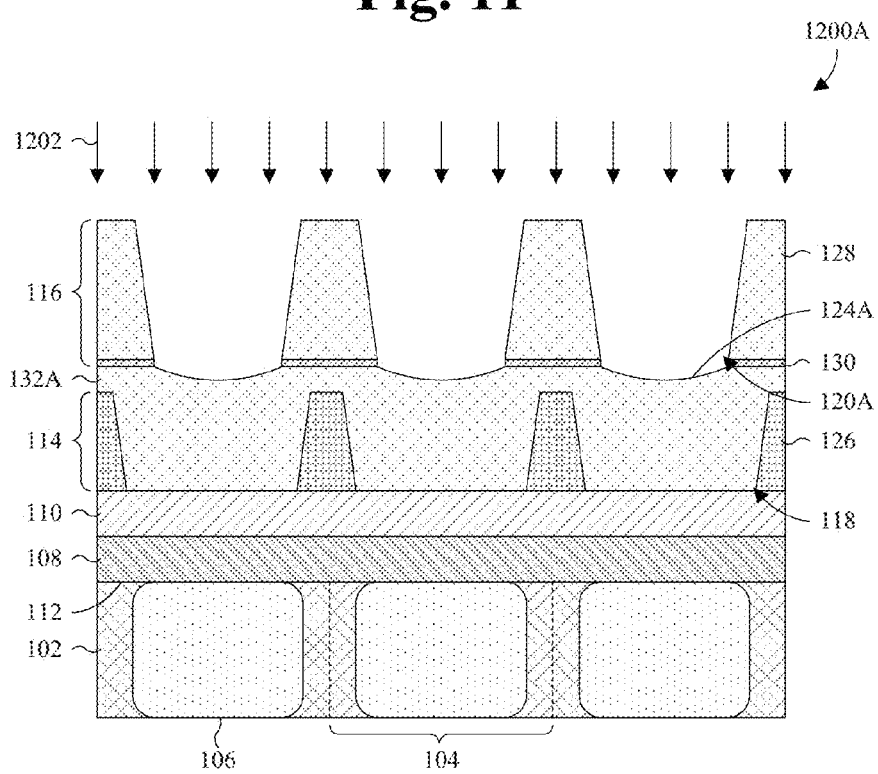

FIGS. 12A & B illustrate cross-sectional views 1200A, 1200B of some embodiments corresponding to Acts 418, 420, and 422. These embodiments are directed towards dielectric grid openings with concave lower surfaces.

As illustrated by FIG. 12A, a fourth etch is performed into the remaining capping layer 132", through exposed regions of the remaining capping layer 132", to form concave lower surfaces 124A for the remaining dielectric grid openings 120". The process for performing the fourth etch may include, for example, applying one or more etchants 1202 to the remaining capping layer 132" with etching parameters, such as etch rates, tuned to define the concave lower surfaces 124A. For example, the etching parameters may be tuned so the remaining capping layer 132" is etched faster at centers of the remaining dielectric grid openings 120" than at peripheries of the remaining dielectric grid openings 120". The one or more etchants 1202 may be selective of the remaining capping layer 132" relative to the remaining etch stop layer 130, and/or may be, for example, a wet or dry etchant. Since the one or more etchants 1202 are applied through the remaining dielectric grid openings 120", and the remaining dielectric grid layer 128 and the remaining capping layer 132" may be the same material, the one or more etchants 1202 may erode sidewalls of the remaining dielectric grid openings 120".

In alternative embodiments, the fourth etch may be replaced with another approach for forming the concave lower surfaces 124A. In some of such alternative embodiments, the concave lower surfaces 124A may be formed by a reflow process (e.g., a servo controlled reflow process). In others of such alternative embodiments, the concave lower surfaces 124A may be formed by a deposition with deposition parameters, such as deposition rates, tuned to define the concave lower surfaces 124A. For example, the deposition parameters may be tuned so the deposition rate is slower at centers of the remaining dielectric grid openings 120" than at peripheries of the remaining dielectric grid openings 120". Such a deposition may be construed as a second capping layer and/or an extension of the remaining capping layer 132".

Figure 12B:
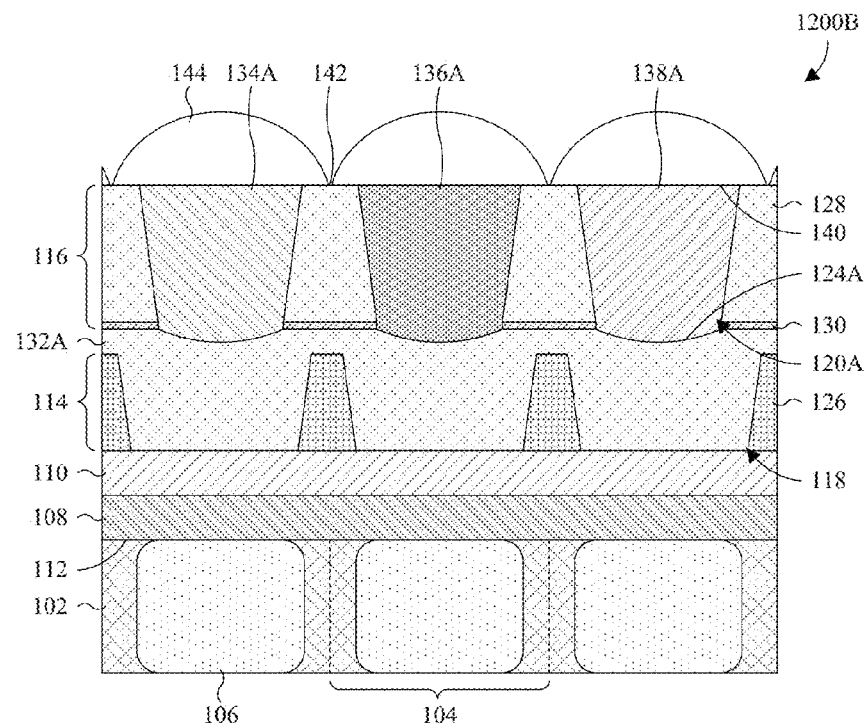

As illustrate by FIG. 12B, color filters 134A, 136A, 138A corresponding to the pixel sensors 104 are formed in the remaining dielectric grid openings 120A of the corresponding pixel sensors 104, typically with upper surfaces 140 approximately even with an upper surface 142 of the remaining dielectric grid layer 128. The color filters 134A, 136A, 138A are assigned corresponding colors or wavelengths of radiation (e.g., according to a Bayer filter mosaic), and formed of materials configured to transmit the assigned colors or wavelengths of radiation to the corresponding pixel sensors 104. Further, the color filters 134A, 136A, 138A are formed with materials having refractive indexes greater than the remaining capping layer 132A, and/or any other material abutting and underlying the concave lower surfaces 124A. The process for forming the color filters 134A, 136A, 138A may include, for each of the different color filter assignments, forming a color filter layer and patterning the color filter layer. The color filter layer may be formed so as to fill the remaining dielectric grid openings 120A and to cover the remaining dielectric grid layer 128. The color filter layer may then be planarized (e.g., by CMP) and/or etched back to about even with the upper surface 142 of the remaining dielectric grid layer 128, before patterning the color filter layer.

As also illustrate by FIG. 12B, micro lenses 144 corresponding to the pixel sensors 104 are formed over the color filters 134A, 136A, 138A of the corresponding pixel sensors 104. The process for forming the micro lenses 144 may include forming a micro lens layer above the color filters 134A, 136A, 138A (e.g., by a spin-on method or a deposition process). Further, a micro lens template having a curved upper surface may be patterned above the micro lens layer. The micro lens layer may then be selectively etched according to the micro lens template to form the micro lenses 144.

Figure 13A:
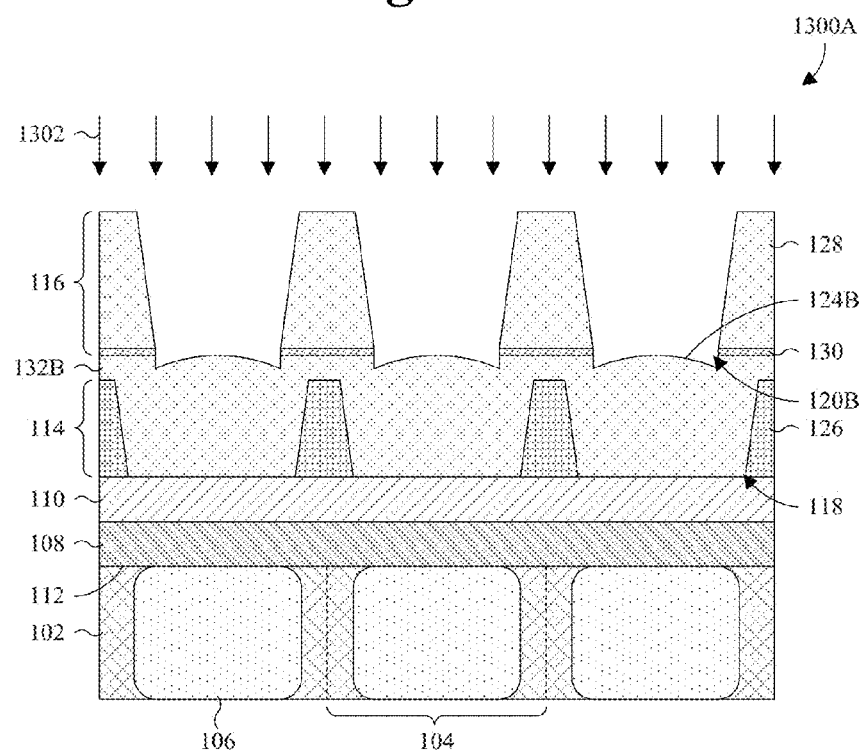

FIGS. 13A & B illustrate cross-sectional views 1300A, 1300B of other embodiments corresponding to Acts 418, 420, and 422. These embodiments are directed towards dielectric grid openings with convex lower surfaces.

As illustrate by FIG. 13A, a fourth etch is performed into the remaining capping layer 132", through exposed regions of the remaining capping layer 132", to form convex lower surfaces 124B for the remaining dielectric grid openings 120". The process for performing the fourth etch may include, for example, applying one or more etchants 1302 to the remaining capping layer 132" with etching parameters tuned to define the convex lower surfaces 124B. For example, the etching parameters may be tuned so the remaining capping layer 132" is etched faster at peripheries of the remaining dielectric grid openings 120" than at centers of the remaining dielectric grid openings 120". The one or more etchants 1302 may be selective of the remaining capping layer 132" relative to the remaining etch stop layer 130, and/or may be, for example, a wet or dry etchant.

In alternative embodiments, the fourth etch may be replaced with another approach for forming the convex lower surfaces 124B. In some of such alternative embodiments, the convex lower surfaces 124B may be formed by a reflow process. In others of such alternative embodiments, the convex lower surfaces 124B may be formed by a deposition with deposition parameters tuned to define the convex lower surfaces 124B. For example, the deposition parameters may be tuned so the deposition rate is slower at peripheries of the remaining dielectric grid openings 120" than at centers of the remaining dielectric grid openings 120". Such a deposition may be construed as a second capping layer and/or an extension of the remaining capping layer 132".

Figure 13B:
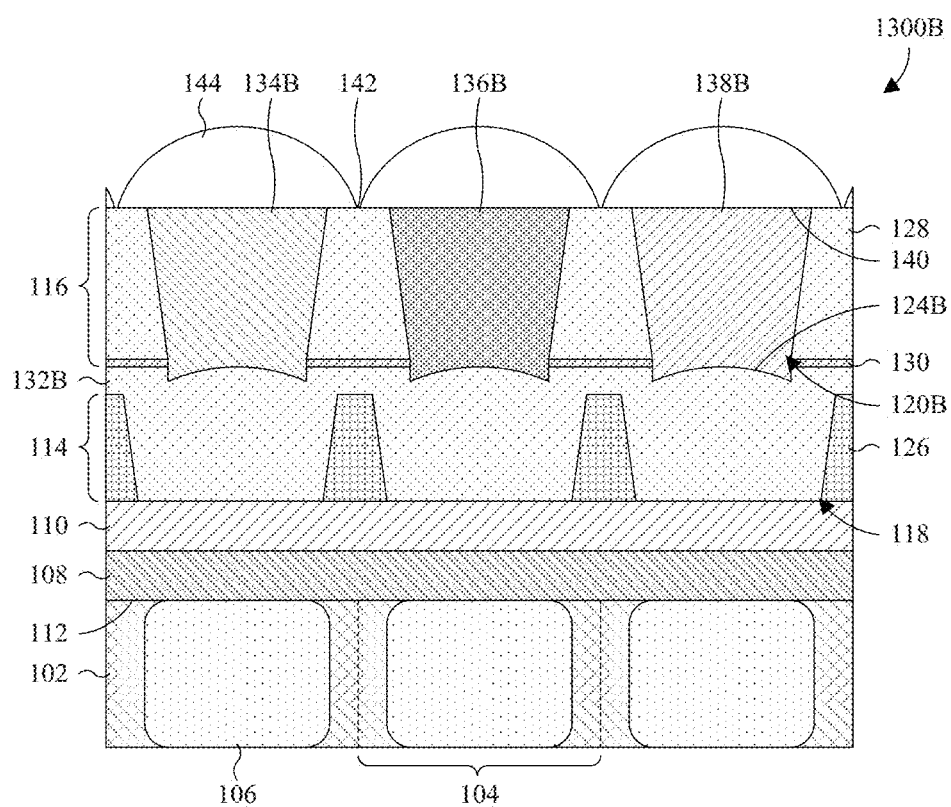

As illustrate by FIG. 13B, color filters 134B, 136B, 138B corresponding to the pixel sensors 104 are formed in the remaining dielectric grid openings 120A of the corresponding pixel sensors 104, typically with upper surfaces 140 approximately even with an upper surface 142 of the remaining dielectric grid layer 128. Further, the color filters 134B, 136B, 138B are formed with materials having refractive indexes less than the remaining capping layer 132B, and/or any other material abutting and underlying the convex lower surfaces 124B.

Also illustrated by FIG. 12B, micro lenses 144 corresponding to the pixel sensors 104 are formed over the color filters 134B, 136B, 138B of the corresponding pixel sensors 104.

Thus, as can be appreciated from above, the present disclosure provides A BSI image sensor. A pixel sensor is arranged within a semiconductor substrate. A metallic grid is arranged over the pixel sensor and defines a sidewall of a metallic grid opening. A dielectric grid is arranged over the metallic grid and defines a sidewall of a dielectric grid opening. A capping layer is arranged over the metallic grid, and defines a curved lower surface of the dielectric grid opening.

In other embodiments, the present disclosure provides a method of forming a BSI image sensor. A pixel sensor is arranged within a semiconductor substrate. A metallic grid is formed over the semiconductor substrate and defines a sidewall of a metallic grid opening. A dielectric grid layer is formed over the metallic grid. One or more etches are performed into the dielectric grid layer to form a dielectric grid opening laterally surrounded by a dielectric grid and having a curved lower surface.

In yet other embodiments, the present disclosure provides a BSI image sensor. A plurality of pixel sensors is arranged within a semiconductor substrate. A metallic grid is arranged over the pixel sensors and defines sidewalls of metallic grid openings corresponding to the pixel sensors. A dielectric grid is arranged over the metallic grid and defines sidewalls of dielectric grid openings corresponding to the pixel. A capping layer is arranged over the metallic grid, and define curved lower surface of the dielectric grid openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back-side illuminated (BSI) image sensor comprising:
   a pixel sensor arranged within a semiconductor substrate;
   a metallic grid arranged over the pixel sensor and defining a sidewall of a metallic grid opening;
   a dielectric grid arranged over the metallic grid and defining a sidewall of a dielectric grid opening;
   a capping layer arranged over the metallic grid, and defining a curved lower surface of the dielectric grid opening; and
   a dielectric grid layer arranged over the capping layer and defining the dielectric grid, wherein the curved lower surface is convex and arranged below a bottom surface of the dielectric grid layer, and wherein the bottom surface of the dielectric grid layer is spaced between a top surface of the dielectric grid layer and a top surface of the capping layer.

2. The BSI image sensor according to claim 1, further comprising:
   a color filter arranged within the dielectric grid opening and abutting the curved lower surface.

3. The BSI image sensor according to claim 2, wherein the color filter has a refractive index less than that of the capping layer.

4. The BSI image sensor according to claim 1, further comprising:
   a back-end-of-line (BEOL) metallization stack arranged on an opposite side of the semiconductor substrate as the metallic grid.

5. A back-side illuminated (BSI) image sensor comprising:
   a plurality of pixel sensors arranged within a semiconductor substrate;
   a metallic grid arranged over the pixel sensors and defining sidewalls of metallic grid openings corresponding to the pixel sensors;
   a dielectric grid arranged over the metallic grid and defining sidewalls of dielectric grid openings corresponding to the pixel sensors;
   a capping layer arranged over the metallic grid, and defining curved lower surfaces of the dielectric grid openings, wherein the curved lower surfaces comprise a curved lower surface that is curved so outer edges of the curved lower surface are closer to the semiconductor substrate than a center of the curved lower surface;

a dielectric grid layer arranged over the capping layer, wherein the dielectric grid is arranged in the dielectric grid layer; and an etch stop layer arranged between the dielectric grid layer and the capping layer, wherein the etch stop layer is a different material than the dielectric grid layer, wherein the etch stop layer has a bottom surface that is spaced above the curved lower surfaces of the dielectric grid openings and that contacts the capping layer.

6. The BSI image sensor according to claim 5, wherein the curved lower surfaces are convex.

7. The BSI image sensor according to claim 5, further comprising:

color filters arranged within the dielectric grid openings and directly abutting the curved lower surfaces.

8. The BSI image sensor according to claim 7, wherein the curved lower surfaces are convex, and wherein the color filters have refractive indexes less than a refractive index of the capping layer.

9. An image sensor comprising:

a semiconductor substrate arranged over a back-end-of-line (BEOL) metallization stack, and comprising an array of pixel sensors arranged in the semiconductor substrate;

a metallic layer arranged over the semiconductor substrate and comprising an array of metallic grid openings corresponding to the pixel sensors, wherein the array of metallic grid openings define a metallic grid in the metallic layer;

a dielectric layer arranged over the metallic layer and comprising an array of dielectric grid openings corresponding to the pixel sensors, wherein the array of dielectric grid openings define a dielectric grid in the dielectric layer;

color filters arranged in the dielectric grid openings;

a capping layer arranged over the metallic layer, between the metallic and dielectric layers, wherein the capping layer fills the metallic grid openings and defines curved lower surfaces of the dielectric grid openings, and wherein the capping layer laterally contacts substantially vertical sidewalls of the color filters;

an antireflective layer arranged over and contacting the semiconductor substrate; and a buffer layer arranged over and contacting the antireflective layer, wherein the capping layer and the metallic layer are arranged over and contact the buffer layer.

10. The image sensor according to claim 9, wherein the curved lower surfaces are convex.

11. The image sensor according to claim 9, further comprising:

color filters arranged in the dielectric grid openings and having different indexes of refraction than the capping layer.

12. The BSI image sensor according to claim 1, further including:

an etch stop layer overlying the capping layer, between the capping layer and the dielectric grid layer, wherein the etch stop layer contacts the bottom surface of the dielectric grid layer and an upper surface of the capping layer, and wherein the curved lower surface is arranged below a bottom surface of the etch stop layer.

13. The BSI image sensor according to claim 12, further comprising:

a color filter arranged within the dielectric grid opening, wherein the dielectric grid layer has an upper surface that is even with an upper surface of the color filter.

14. The BSI image sensor according to claim 1, further including:

an etch stop layer arranged between and contacting the dielectric grid layer and the capping layer, wherein the etch stop layer is a different material than the dielectric grid layer.

15. The BSI image sensor according to claim 5, wherein the etch stop layer contacts the dielectric grid and capping layers.

16. The BSI image sensor according to claim 15, wherein the etch stop layer is arranged along a bottom of the dielectric grid openings.

17. The image sensor according to claim 10, further comprising:

an etch stop layer arranged between and contacting the dielectric layer and the capping layer, wherein the curved lower surfaces are arranged below a bottom surface of the etch stop layer.

* * * * *